United States Patent
Chung

[11] Patent Number: 5,843,845
[45] Date of Patent: Dec. 1, 1998

[54] METHOD FOR FORMING SLOPED CONTACT HOLE FOR SEMICONDUCTOR DEVICE

[75] Inventor: Seong Woo Chung, Choongcheongbuk-Do, Rep. of Korea

[73] Assignee: LG Semicon Co., Ltd., Chungcheongbuk-Do, Rep. of Korea

[21] Appl. No.: 773,852

[22] Filed: Dec. 27, 1996

[30] Foreign Application Priority Data

Dec. 27, 1995 [KR] Rep. of Korea .................. 58735/1995

[51] Int. Cl.⁶ ...................... H01L 21/308; H01L 21/3065
[52] U.S. Cl. .......................... 438/713; 438/640; 438/723
[58] Field of Search ................... 438/723, 640, 438/713

[56] References Cited

U.S. PATENT DOCUMENTS

| | | |
|---|---|---|
| 4,671,849 | 6/1987 | Chen et al. . |
| 4,698,128 | 10/1987 | Berglund et al. . |
| 4,814,041 | 3/1989 | Auda . |
| 4,902,377 | 2/1990 | Berglund et al. . |
| 5,201,993 | 4/1993 | Langley ................................. 438/723 |
| 5,429,710 | 7/1995 | Akiba et al. ............................ 438/723 |

Primary Examiner—Janis L. Dote
Attorney, Agent, or Firm—Morgan, Lewis & Bockius LLP

[57] ABSTRACT

A method for forming a contact hole for a semiconductor device includes forming an insulation layer on a substrate and forming a photoresist film pattern on the insulation layer and exposing a portion of the insulation layer corresponding to the photoresist film pattern. The insulation layer is etched using the photoresist film pattern as a mask using a high density plasma etcher of an inductively coupled plasma type. The photoresist film is removed to form a contact hole having a sloped side wall.

14 Claims, 5 Drawing Sheets

METHOD FOR FORMING SLOPED CONTACT HOLE FOR SEMICONDUCTOR DEVICE

BACKGROUND OF THE INVENTION

1. Field of the Invention

The present invention relates to a semiconductor device and more particularly, to a contact hole forming method for a semiconductor device.

2. Description of the Related Art

The development of highly integrated semiconductor devices has reduced the size of the semiconductor devices which also has reduced the size of contact holes. Thus, when forming a contact hole using a dry etching method, an overlay margin defect occurs because a side wall of the semiconductor device is vertical. Moreover, a step coverage problem occurs in a subsequent process.

In order to solve the above-mentioned problems, a contact hole forming process has been introduced in the industry where the contact hole has a sloped side wall profile, as shown in FIGS. 1 through 4. The above-mentioned process will now be explained in detail.

Referring to FIGS. 1A through 1D, a conventional sloped contact hole formation process which uses a plurality of insulation layers having different etching rates is explained. As a first process, an insulation layer 12 consisting of an $SiO_2$ layer 12A and a PSG layer 12B having different etching rates is formed on a substrate 11, as shown in FIG. 1A. A photoresist film pattern 13 is formed by depositing a photoresist film on a PSG layer 12B and patterning the film. Here, a predetermined surface of the insulation layer 12 is exposed.

Next, as a second process, an insulation layer 12 of which a surface of the same is exposed is etched under a $CHF_3/O_2$ chemical gas environment using the photoresist pattern 13 as a mask. Thus, first and second openings 14 and 15 are formed, as shown in FIGS. 1B and 1C, respectively.

Here, the etching step of the insulation layer 12 is divided into two substeps. First, the first opening 14, as shown in FIG. 19, is formed by etching the PSG layer 12B by using 15% by weight of $O_2$ (based on the total amount of gas flow) until the lower surface of the $SiO_2$ layer is exposed. Thereafter, the second opening 15, as shown in FIG. 1C, is formed by etching the $SiO_2$ layer 12A by using 3% by weight of $O_2$ (based on the total amount of gas flow) until the surface of the substrate is exposed. Since the $SiO_2$ layer 12A has a low etching rate with respect to $CHF_3$, the PSG layer 12B is also etched when etching the $SiO_2$ layer 12A in the second step. Thus, the slope of the first opening 14 is increased.

Then, as a third process, an etching process shown in FIG. 1D is performed by using 90% by weight of $O_2$, and a contact hole having a predetermined slope is formed, thus completing the contact hole fabrication process. Here, the photoresist film pattern 13 is etched more quickly than the insulation layer 12 when using 90% by weight of $O_2$ based on the total gas flow for the etching (in the drawings, the etched portion is indicated by a broken line). As explained above, since the PSG layer 12B is etched more rapidly than the $SiO_2$ layer 12A, a sloped contact hole, as shown in FIG. 1D, is formed.

However, when forming a sloped contact hole in the above-mentioned process, since the insulation layer consisting of a PSG layer and an $SiO_2$ layer is formed by adjusting the amount of $O_2$ at each process, the process is complex. Moreover, since the photoresist film pattern is also etched when etching the insulation layer, a mask erosion phenomenon occurs, making it difficult to reproduce the process.

Next, referring to FIGS. 2A through 2D, a conventional sloped contact hole formation method using an isotropic etching process and an anisotropic etching process will now be explained.

As a first process, an interlayer insulation layer 22, as shown in FIG. 2A, is formed on a first conductive layer 21, and a photoresist film pattern 23 is formed on the interlayer insulation layer 22 by applying and patterning a photoresist on the interlayer insulation layer, and an opening 24 is formed by isotopically etching the interlayer insulation layer 22 using the photoresist film pattern 23 as a mask. A via hole in the interlayer insulation layer 22 is expanded further at the lower portion of the opening 24 by anisotropically etching the interlayer insulation layer 22 using the photoresist film pattern 23 as a mask.

As a second process, the side wall and upper surface of the photoresist film pattern 23 (in the drawings, a portion indicated by the broken lines), as shown in FIG. 2B, are isotropically etched in a mask erosion process. When repeatedly performing the above-mentioned isotropic-etching and mask erosion process, a via hole 25 having a slope, as shown in FIG. 2C, is formed.

As a third process, the photoresist film pattern 23 is removed, as shown in FIG. 2D, and a second insulation layer 26 is applied over the interlayer insulation layer 22. A conductive layer having a better step coverage in the via hole 25 is formed, thus completing the contact hole fabrication process.

However, when forming the sloped contact hole in the above-mentioned process, since it is necessary to repeatedly perform the isotropic-etching process and anisotropic-etching process, the whole process becomes complex. Moreover, since the slope is stair-shaped, it is difficult to form a desired contact hole having a desired slope.

Next, referring to FIGS. 3A through 3D, another conventional sloped contact hole formation process will be explained. The slope is formed in an etching process which is carried out several times on the photoresist film and the substrate.

As a first process and referring to FIG. 3A, a photoresist film is applied on the substrate 31 and a photoresist film pattern 32 and an opening 33 are concurrently formed. The photoresist film is patterned so that a predetermined surface of the substrate is exposed.

As a second process, a substrate 31 is etched to a predetermined thickness using the photoresist pattern 32 as a mask, as shown in FIG. 3B. The photoresist film pattern 32 indicated by the broken line in FIG. 3C, is etched, and as shown in FIG. 3D, the substrate 31 is also etched to a predetermined thickness using the etched photoresist film pattern 32 as a mask. Thus, a contact hole 34 having a slope is finally formed by repeatedly performing the above-mentioned processes.

However, since the contact hole is formed by repeatedly performing the photoresist film etching step and the substrate etching step, the whole process becomes complex. In addition, the reproducibility of the presses deteriorates and since the slope is stair-shaped, it is very difficult (if not impossible) to form a contact hole having a desired slope.

Finally, another conventional slope contact hole formation process, which is directed to adjusting the amount of $CHF_3/CF_4$ gas, will be explained with reference to FIGS. 4A through 4B.

As a first process, an insulation layer 42 (for example, an oxide film) is formed on a substrate (not shown) to a predetermined thickness, as shown in FIG. 4A. A metallic conductive layer 41 is also formed on the substrate, and the insulation layer 42 covers the metallic conductive layer 41. A photoresist film pattern 43 and an opening 44 are formed by patterning the photoresist film so as to expose a predetermined surface of the insulation layer 42.

As a second process, a contact hole 45 is formed, as shown in FIG. 4B, by etching the insulation layer 42 until the surface of the conductive layer 41 is exposed. This is done by adjusting the amount of $CHF_3/CF_4$ gas using the photoresist film pattern 43 as a mask.

The etching step with respect to the insulation layer 42 is performed in two stages. First, a large slope is formed by etching the insulation layer 42 using $CHF_3$ in an amount of more than 25%. Then, a predetermined slope is formed by etching the insulation layer 42 by using $CHF_3$ in an amount of 5% to 25%. Here, when etching the insulation layer 42 by using $CHF_3$ in an amount of 5% to 25%, the amount of $CF_4$ used in the second etching stage is greater than in the first stage. Hence, the photoresist pattern 43 also becomes etched, and the etching process is performed using the photoresist pattern 43 as a mask. Thus, a sloped contact hole 45 is formed, as shown in FIG. 4B.

When forming a contact hole having a predetermined slope in the above-mentioned processes of FIGS. 4A and 4B, the process is relatively simple compared to the processes as shown in FIGS. 1A–1D, 2A–2D, and 3A–3D. However, when performing the etching in the second stage of the second process, since the amount of $CF_4$ is increased, it is difficult to maintain a large slope which is formed in the first process. Thus, process reproducibility deteriorates.

Accordingly, since the conventional sloped contact hole is formed through a plurality of steps, the whole process becomes complex. Moreover, since the process is performed using a mask erosion method, the process reproducibility deteriorates.

SUMMARY OF THE INVENTION

Accordingly, the present invention is directed to a method for forming sloped contact hole that substantially obviates one or more of the problems due to limitations and disadvantages of the related art.

An object of the present invention is to provide a sloped contact hole formation method having a simple process, an improved step coverage, and a desired overlay margin.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for forming a contact hole for a semiconductor device, the method including the steps of forming an insulation layer on a substrate; forming a photoresist film pattern on the insulation layer and exposing a portion of the insulation layer corresponding to the photoresist film pattern; etching the insulation layer using the photoresist film pattern as a mask using a high density plasma etcher of an inductively coupled plasma type; and removing the photoresist film to form a contact hole having a sloped side wall.

In another aspect, the present invention provides a method for forming a contact hole for a semiconductor device, the method including the steps of forming an insulating layer on a substrate; forming a photoresist film pattern on the insulating layer and exposing a portion of the insulating layer corresponding to the photoresist pattern; etching the insulation layer using the photoresist film pattern as a mask using a high density plasma etcher under a gas environment including a gas combination of a polymer formation gas and one of $C_2F_6$ or $C_3F_8$, a bias power of about 700 W–1500 W applied to the etcher, and a source power of about 800 W–3000 W applied to the etcher; and removing the photoresist film to form a contact hole having a sloped side wall.

In a further aspect, the present invention provides a slope contact hole formation method using a high density plasma etcher including the steps of a first step for forming an insulation layer on a substrate; a second step for forming a photoresist film pattern on the insulation layer, leaving a predetermined portion of the insulation layer; a third step for etching the insulation layer using the photoresist film as a mask in a high density plasma etcher of an inductively coupled plasma type; and a fourth step for forming a contact hole having a sloped side wall profile by removing the photoresist film, thereby achieving a simple process.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

The present invention is directed to forming a contact hole having a large slope using a single recipe through an optimization of gas chemistry mixture, power condition, and chamber temperature by using a high density plasma etcher of the present invention.

Figure 1A:
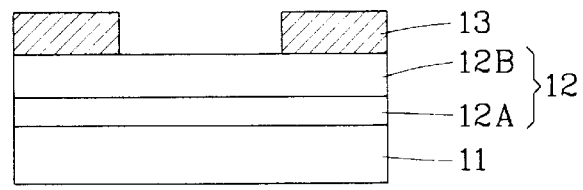
FIGS. 1A through 1D are cross-sectional views illustrating a process for forming a first conventional sloped contact hole.
Figure 1B:
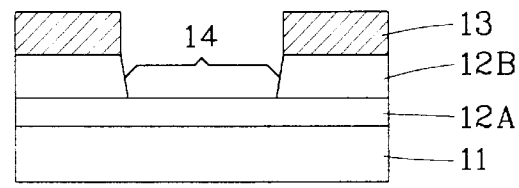
Figure 1C:
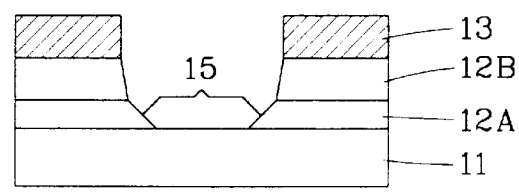
Figure 1D:
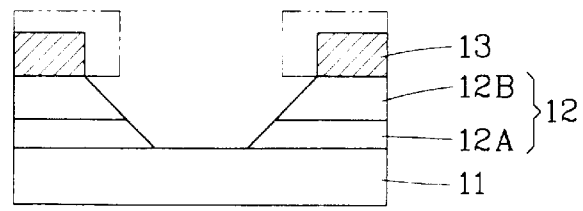
Figure 2A:
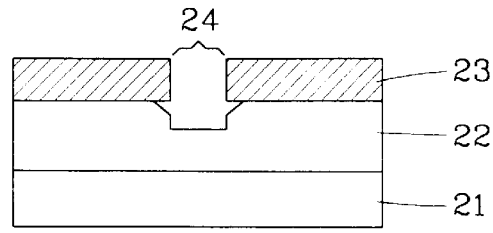
FIGS. 2A through 2D are cross-sectional views illustrating a process of forming a second conventional sloped contact hole.
Figure 2B:
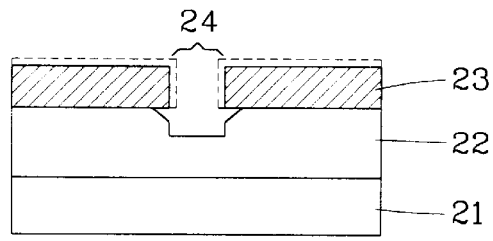
Figure 2C:
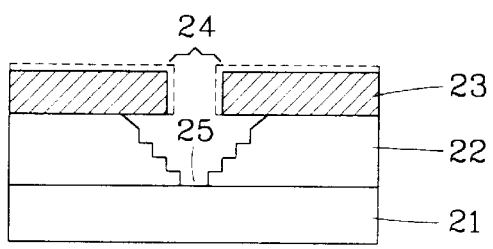
Figure 2D:
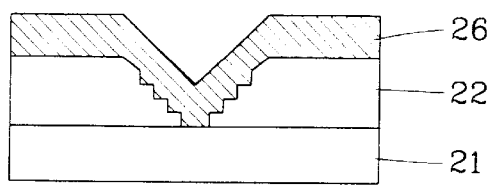
Figure 3A:
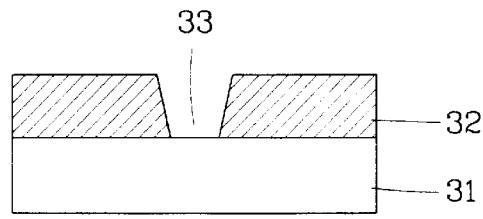
FIGS. 3A through 3D are cross-sectional views illustrating a process of forming a third conventional sloped contact hole.
Figure 3B:
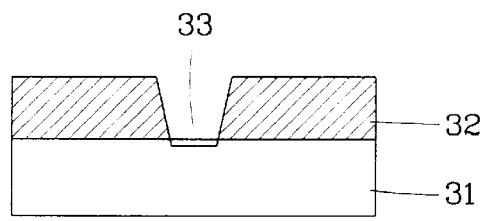
Figure 3C:
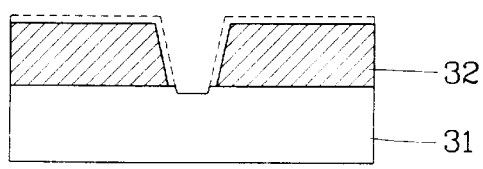
Figure 3D:
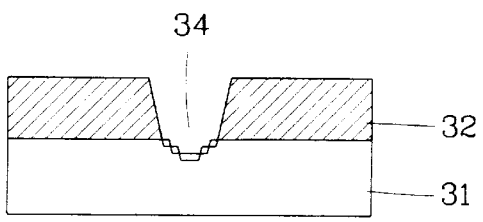
Figure 4A:
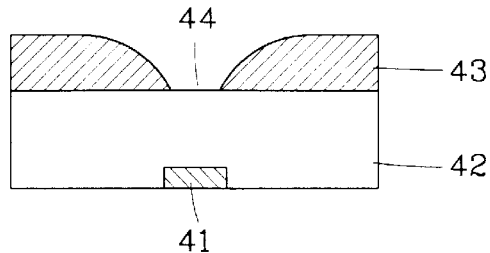
FIGS. 4A and 4B are cross-sectional views illustrating a process of forming a fourth conventional sloped contact hole.
Figure 4B:
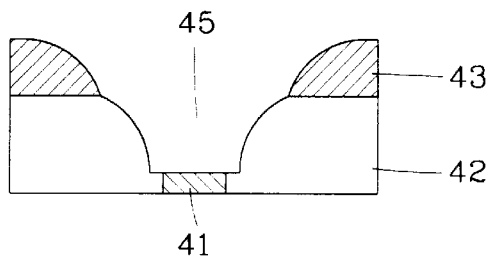
Figure 5A:
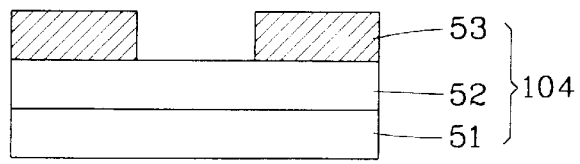
FIGS. 5A through 5C are cross-sectional views illustrating a process of forming a sloped contact hole in accordance with the present invention.
Figure 5B:
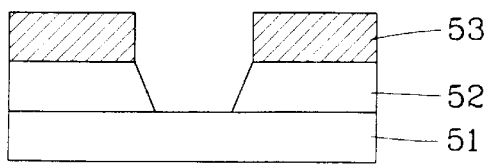
Figure 5C:
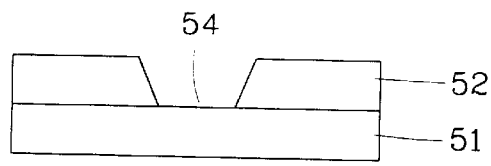

Referring to FIGS. 5A through 5C, the method for forming a contact hole of the present invention having a large slope will now be explained.

In the present invention, an insulation layer 52 (made of $SiO_2$, for example) is formed to a thickness of approximately 600 Å on a silicon substrate 51, as shown in FIG. 5A. A photoresist film, which is to be used as a mask, is formed on the insulation layer 52 having an area of approximately 0.4 $\mu m \times 0.4$ $\mu m$. A test wafer 104, including a silicon substrate 51, an insulation layer 52, and a photoresist film pattern 53, is formed by patterning the photoresist film so that a predetermined portion of the insulation layer 52 is exposed.

Figure 6:
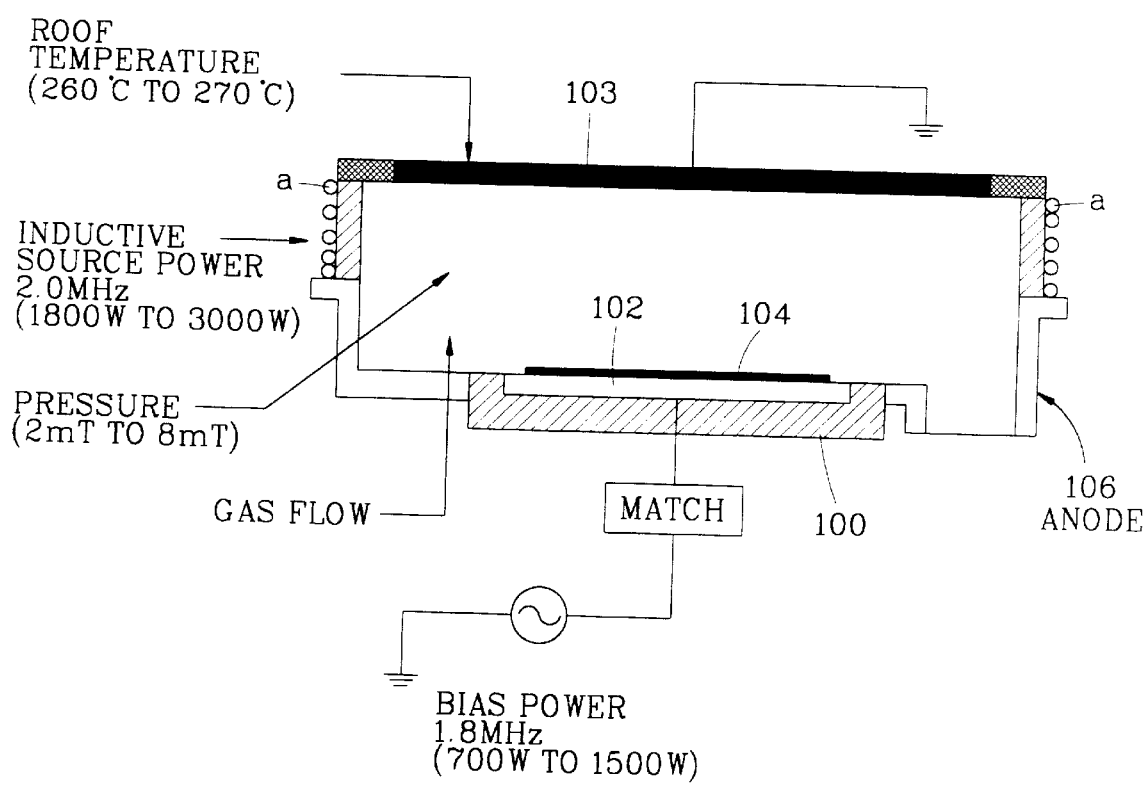
FIG. 6 is a schematic cross-sectional view of a high density plasma etcher of an inductively coupled plasma type that is used for forming a sloped contact hole of FIG. 5 in accordance with the present invention.

As shown in FIG. 6, the test wafer 104 is placed in a high density plasma etcher of an inductively coupled plasma (ICP) type, which includes an electrode 100 to which the bias power is supplied, a wafer pedestal 102, a roof 103, and anodes 106. The high density plasma etcher of an inductively coupled plasma (ICP) type according to the present invention operates during the etching process of an insulation layer through the following steps. First, the test wafer 104 is mounted on the wafer pedestal 102 attached to the electrode 100. The bias power is supplied to the electrode 100. Then, the pedestal 102 is loaded into the chamber of the etcher. Then, conditions such as gas chemistry combination of the etcher, electric power, and chamber temperature are optimized with respect to the insulation layer etching process. More specifically, source power of 1,800 W to 3,000 W is supplied to the induction coil "a" attached to a predetermined portion of each anode 106, whereby the wall temperature of the chamber is fixed at 220° C., and the temperature of the roof 103 is in the range of 250° C. to 270° C. Afterwards, bias power of 700 W to 1,500 W is supplied to the electrode 100. Next, the insulation layer 52 is etched using the photoresist film pattern 53 as a mask to expose a predetermined surface of the substrate 51. In other words, an etching gas having a gas such as $C_2F_6$ or $C_3F_8$ added to a polymer formation gas such as CO or $CH_3F$ is injected into the chamber. At this time, the etching gas which is injected into the chamber is disassociated by the source power, and then the high density plasma is generated. The ions of the generated plasma are drawn over the test wafer 104 by the bias power, and then an insulation layer which is shown in FIG. 5C is rapidly etched by the ions.

The gas used in the above-mentioned process is a gas compound that is made by adding CO or $CH_3F$ (used for polymer formation) to $C_2F_6$ or $C_3F_8$. Here, the amount of $C_2F_6$ or $C_3F_8$ added is about 10–100 sccm and the amount of CO or $CH_3F$ added is 10–100 sccm.

The optimum condition for the above process is as follows. The source power is preferably at about 1800 W–3000 W, the bias power is preferably at about 700 W–1500 W, and the temperature of the roof is within a range of about 250° C.–270° C. The temperature of the chamber wall is fixed at about 220° C. Also, the pressure within the chamber is in a range of about 2 mT–8 mT.

FIG. 6 shows a schematic construction of the chamber of a high density plasma etcher of an ICP type that is used in the etching process of the insulation layer 52 of the present invention. The above-mentioned chamber has a similar construction as the chamber of the conventional plasma etcher, except that an induction coil "a" to which a source power is applied is attached at predetermined portions of both anodes.

When attaching an induction coil "a" and performing an etching process by applying the optimized gas chemistry combination, power condition, and chamber temperature, as described above, an electric field is formed both at the electrode side (the hatched portion in FIG. 6), to which a bias power is applied, and at the induction coil. This causes the etching gas introduced into the chamber to disassociate rapidly, thereby forming a radical. Thus, it is possible to more rapidly conduct the etching with respect to the insulation layer using the above-mentioned condition of the present invention. Thereafter, a sloped contact hole 54 is formed by removing the photoresist film pattern 53, as shown in FIG. 5C, thus completing the process.

An insulation layer was etched, as a sample, by providing a test wafer (as shown in FIG. 5A) in the chamber of the ICP type, high density plasma etcher of the present invention with the following etching conditions: (1) gas chemistry combination of $C_2F_6$/CO, (2) source power at about 2000 W–2400 W, (3) bias power at about 1000 W–1200 W, (4) roof temperature of about 250° C.–260° C., and (5) wall temperature fixed at about 220° C. From these conditions, the following result was obtained.

First, when the etching of the insulation layer was performed at a roof temperature of about 250° C., the angle of the slope of the contact hole was about 83°–84°, and when the roof temperature was at about 260° C., the angle of the slope of the contact hole was about 77°–78°. Thus, a better result was obtained when the etching was conducted at a roof temperature of 260° C. rather than at 250° C.

Second, when changing the power level, large changes were not detected when the source power and bias power were low; however, at the side wall of the slope, a desired result was achieved.

Accordingly, the present invention provides a method for forming a sloped contact hole through a single process using a high density plasma etcher to achieve a simple process, improve step coverage, and a desired overlay margin.

As described above, the sloped contact hole formation method using a high density plasma etcher of an ICP type according to the present invention has the following advantages.

First, the present invention makes it possible to simplify the process as compared with conventional methods directed to forming a sloped contact hole using conventional reactive ion etching (RIE), conventional magnetically enhanced reactive ion etching (MERIE), or conventional plasma type etcher.

Second, the present invention makes it possible to improve step coverage and achieve a desired overlay margin with an underlying pattern.

Third, the process becomes simple and substrate damage can be reduced. Thus, a reliable sloped contact hole is formed as compared with the technique for forming a sloped contact hole using a contact spacer.

It will be apparent to those skilled in the art that various modifications and variations can be made in the method for forming sloped contact hole for semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming a contact hole for a semiconductor device, the method comprising the steps of:

forming an insulation layer on a substrate;

forming a photoresist film pattern on the insulation layer and exposing a portion of the insulation layer corresponding to the photoresist film pattern;

etching the insulation layer using the photoresist film pattern as a mask and using an inductively coupled plasma in the environment of a chemical gas combination including one of $C_2F_6$/polymer formation gas or $C_3F_8$/polymer formation gas, wherein each polymer formation gas includes one of CO or $CH_3F$; and removing the photoresist film to form a contact hole having a sloped side wall.

2. The method according to claim 1, wherein the $C_2F_6$/polymer formation gas combination contains an amount of $C_2F_6$ in a range of about 10 sccm–100 sccm.

3. The method according to claim 1, wherein the $C_3F_8$/polymer formation gas combination contains an amount of $C_3F_8$ in a range of about 10 sccm–100 sccm.

4. The method according to claim 1, wherein the $C_2F_6$/polymer formation gas combination contains an amount of polymer formation gas in a range of about 10 sccm–100 sccm.

5. The method according to claim 1, wherein the $C_3F_8$/polymer formation gas combination contains an amount of polymer formation gas in a range of about 10 sccm–100 sccm.

6. The method according to claim 1, wherein the etching step is performed with an inductively coupled plasma device having an induction coil where a source power is applied, an electrode coupled to the substrate where a bias power is applied, a roof coupled to the induction coil, and a chamber wall, wherein the bias power is about 700 W–1500 W and the source power is about 1800 W–3000 W.

7. The method according to claim 1, wherein the etching step is performed with an inductively coupled plasma device having a roof and a chamber wall, wherein the roof has a temperature in the range of about 250° C.–270° C. and the chamber wall has a temperature of about 220° C.

8. The method according to claim 1, wherein the insulation layer is formed with a silicon oxide film.

9. A method for forming a contact hole for a semiconductor device, the method comprising the steps of:

forming an insulating layer on a substrate;

forming a photoresist film pattern on the insulating layer and exposing a portion of the insulating layer corresponding to the photoresist pattern;

etching the insulation layer using the photoresist film pattern as a mask using a plasma etcher under a gas environment including a gas combination of a polymer formation gas and one of $C_2F_6$ or $C_3F_8$, a bias power of about 700 W–1500 W applied to the etcher, and a source power of about 800 W–3000 W applied to the etcher; and removing the photoresist film to form a contact hole having a sloped side wall.

10. The method according to claim 9, wherein the polymer formation gas includes one of CO or $CH_3F$.

11. The method according to claim 9, wherein the gas combination contains an amount of $C_2F_6$ or $C_3F_8$ in a range of about 10 sccm–100 sccm.

12. The method according to claim 9, wherein the gas combination contains an amount of polymer formation gas in a range of about 10 sccm–100 sccm.

13. The method according to claim 9, wherein the etching step is performed with a roof temperature of the etcher in the range of about 250° C.–270° C. and a chamber wall temperature of the etcher of about 220° C.

14. The method according to claim 9, wherein the insulation layer is formed with a silicon oxide film.

* * * * *